United States Patent
Sonderman et al.

(10) Patent No.: US 6,802,045 B1
(45) Date of Patent: Oct. 5, 2004

(54) METHOD AND APPARATUS FOR INCORPORATING CONTROL SIMULATION ENVIRONMENT

(75) Inventors: Thomas J. Sonderman, Austin, TX (US); Anthony J. Toprac, Austin, TX (US); Anastasia Oshelski Peterson, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 265 days.

(21) Appl. No.: 09/838,498

(22) Filed: Apr. 19, 2001

(51) Int. Cl.[7] .............................................. G06F 17/50
(52) U.S. Cl. ............................... 716/2; 703/14; 703/22
(58) Field of Search ......................... 703/14, 22; 716/4

(56) References Cited

U.S. PATENT DOCUMENTS 5,590,063 A * 12/1996 Golio et al. ................. 702/64
6,530,069 B2 * 3/2003 Jennion et al. ............... 716/15
6,581,029 B1 * 6/2003 Fischer ........................ 703/14
2002/0133801 A1 * 9/2002 Granik et al. ................ 716/21

* cited by examiner

*Primary Examiner*—Eddie Lee
*Assistant Examiner*—Douglas W. Owens
(74) *Attorney, Agent, or Firm*—Williams, Morgan & Amerson, P.C.

(57) ABSTRACT

The present invention provides for a method and an apparatus for implementing a control simulation environment into a manufacturing environment. A process task is defined. A process simulation function is performed to produce simulation data corresponding to the process task. The simulation data is integrated with a process control environment for controlling a manufacturing process of a semiconductor device.

31 Claims, 10 Drawing Sheets

METHOD AND APPARATUS FOR INCORPORATING CONTROL SIMULATION ENVIRONMENT

BACKGROUND OF THE INVENTION

1. Field of the Invention

This invention relates generally to semiconductor manufacturing, and, more particularly, to a method and apparatus for integrating a simulation environment into a semiconductor manufacturing process environment.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include start-up effects of manufacturing machine tools, memory effects of manufacturing chambers, and first-wafer effects. Furthermore, changes in one aspect of a manufacturing processing step can lead to adverse effects during another portion of the manufacturing processing step.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes is required, improved methods are needed to revise input parameters that control manufacturing processes in a more automated and timely manner. Furthermore, wafer-to-wafer manufacturing variations can cause non-uniform quality of semiconductor devices.

A known technique for evaluating the acceptability of the photolithography and other processes involves measuring critical dimensions or other parameters after the process is performed. Many times, these measurements lead to manufacturing solutions that can only be implemented during a subsequent manufacturing process. A more efficient means of predicting possible errors based upon adjustments made upon manufacturing control parameters (for a variety of steps performed by a plurality of processing tools) can lead to higher production accuracy.

The present invention is directed to overcoming, or at least reducing the effects of, one or more of the problems set forth above.

SUMMARY OF THE INVENTION

In one aspect of the present invention, a method is provided for implementing a control simulation environment into a manufacturing environment. A process task is defined. A process simulation function is performed to produce simulation data corresponding to the process task. The simulation data is integrated with a process control environment for controlling a manufacturing process of a semiconductor device.

In another aspect of the present invention, a system is provided for implementing a control simulation environment into a manufacturing environment. The system of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data analysis unit coupled with the metrology, the metrology data analysis unit being capable of organizing the acquired metrology data; and a simulation environment coupled to the metrology data analysis unit and the computer system, the simulation environment capable of producing simulation data for controlling manufacturing of semiconductor wafers.

BRIEF DESCRIPTION OF THE DRAWINGS

The invention may be understood by reference to the following description taken in conjunction with the accompanying drawings, in which like reference numerals identify like elements, and in which.

Figure 1:
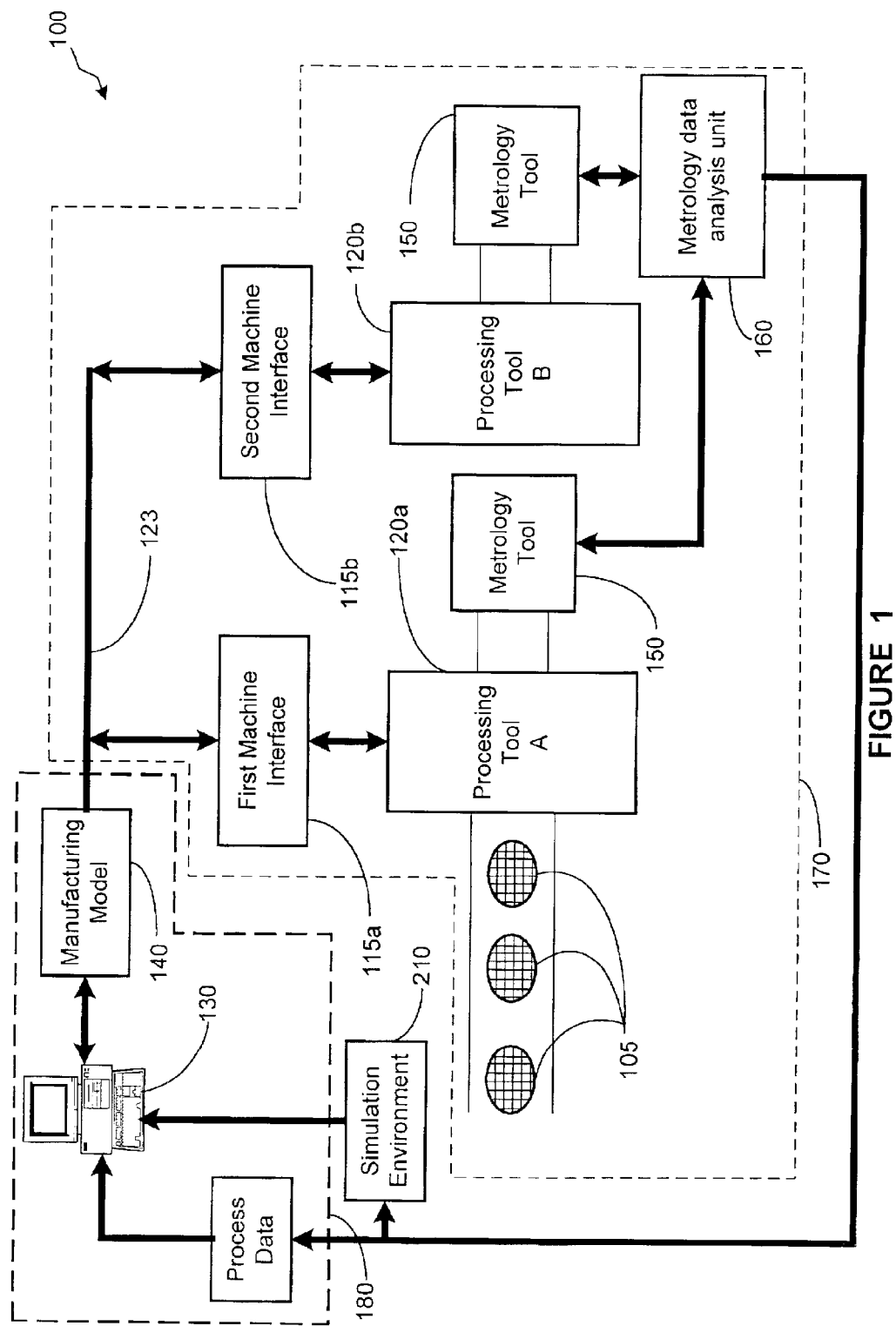
FIG. 1 illustrates a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer and wafer-lot to wafer-lot variations can result in an output of non-uniform semiconductor devices. Furthermore, attempts to overcome wafer errors during manufacturing can be adversely affected by modifications made during one aspect of manufacturing that causes errors on another aspect of manufacturing. One or more embodiments of the present invention provides for performing a simulation function and integrating the simulation function with a process control environment and a manufacturing environment.

Semiconductor devices are processed in a manufacturing environment using a number of input control parameters. Turning now to FIG. 1, a system 100 in accordance with one embodiment of the present invention is illustrated. The system 100 comprises a process control environment 180, a manufacturing/processing environment 170, and a simulation environment 210. The process control environment 180 controls the operations of the manufacturing environment 170. In one embodiment, the process control environment comprises an APC framework. The process control environment 180 can receive data from the manufacturing environment 170 and the simulation environment 210 and make appropriate changes to manufacturing control parameters to affect the operations of the manufacturing environment 170.

In one embodiment, semiconductor devices 105, such as semiconductor wafers, are processed on processing tools 120a, 120b using a plurality of control input signals, or manufacturing parameters, on a line 123. In one embodiment, control input signals, or process signals that carry manufacturing control parameters, on the line 123, are sent to the processing tools 120a, 120b from a computer system 130 via machine interfaces 115a, 115b. In one embodiment, the first and second machine interfaces 115a, 115b are located outside the processing tools 120a, 120b. In an alternative embodiment, the first and second machine interfaces 115a, 115b are located within the processing tools 120a, 120b.

In one embodiment, the computer system 130 sends control input signals, or manufacturing parameters, on the line 123 to the first and second machine interfaces 115a, 115b. The computer system 130 employs a manufacturing model 140 to generate the control input signals on the line 123. In one embodiment, the manufacturing model 140 contains a manufacturing recipe that determines a plurality of control input parameters that are sent on the line 123.

In one embodiment, the manufacturing model 140 defines a process script and input control that implement a particular manufacturing process. The control input signals on the line 123 that are intended for the processing tool A 120a are received and processed by the first machine interface 115a. The control input signals on the line 123 that are intended for the processing tool B 120b are received and processed by the second machine interface 115b. Examples of the processing tools 120a, 120b used in semiconductor manufacturing processes are steppers, scanners, step-and-scan tools, etch process tools, and the like. In one embodiment, the processing tool A 120a and the processing tool B 120b are photolithography process tools, such as steppers.

One or more of the semiconductor wafers 105 that are processed by the processing tools 120a, 120b can also be sent to a metrology tool 150 for acquisition of metrology data. The metrology tool 150 can be a scatterometry data acquisition tool, an overlay-error measurement tool, a critical dimension measurement tool, and the like. In one embodiment, one or more processed semiconductor wafers are examined by the metrology tool 150. Data from the metrology tool 150 is collected by a metrology data analyzer unit 160. The metrology data analyzer unit 160 organizes, analyses, and correlates scatterometry metrology data acquired by the metrology tool 150, to particular semiconductor wafers 105 that were examined. The metrology data analyzer unit 160 can be a software unit, a hardware unit, or a firmware unit. In one embodiment, the metrology data analyzer unit 160 is integrated into the computer system 130.

Figure 2:
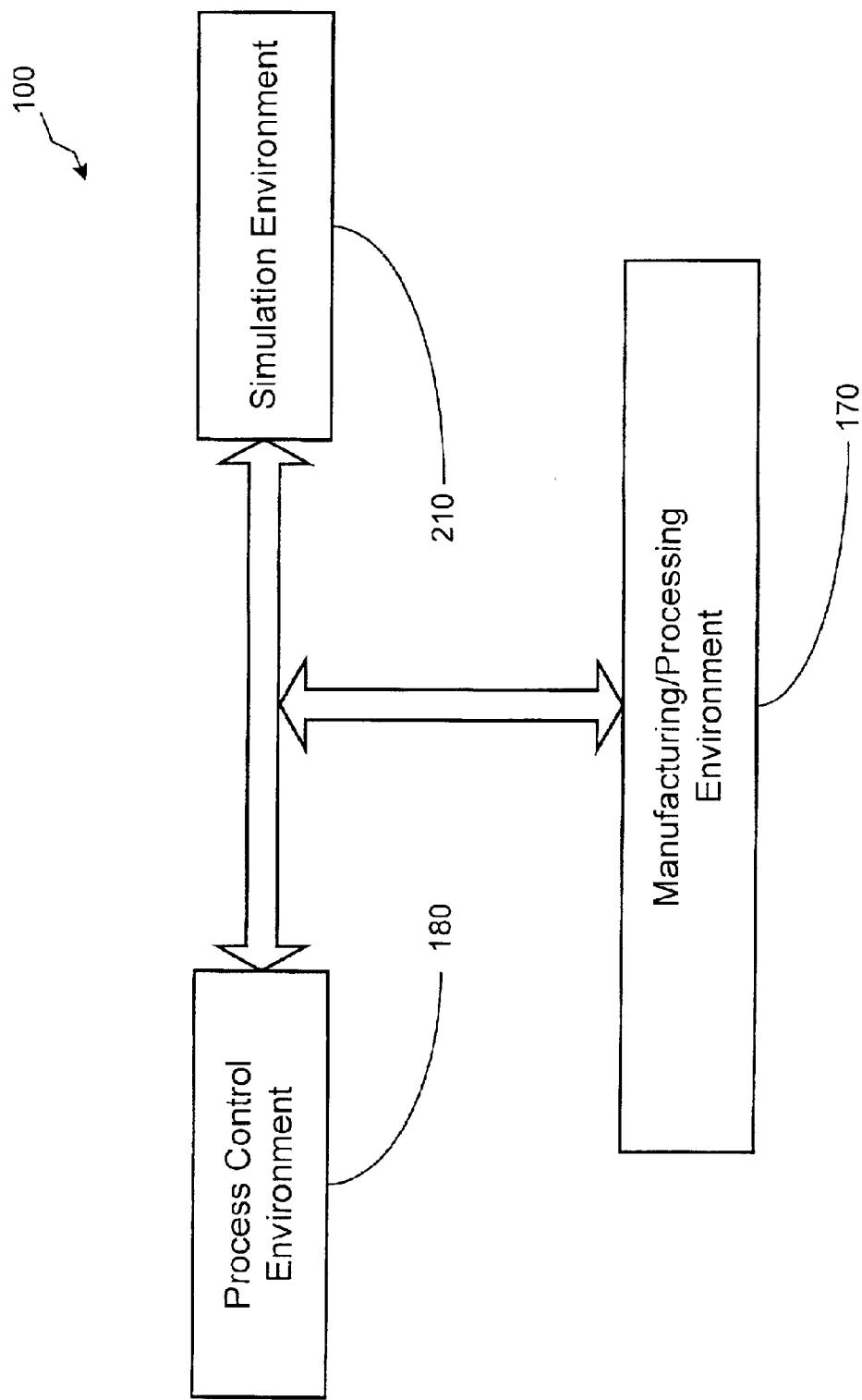
FIG. 2 illustrates a simplified block diagram depiction of an interaction between a process control environment, a simulation environment, and a manufacturing/processing environment, in accordance with one embodiment of the present invention.

Referring now to FIGS. 1 and 2 simultaneously, one embodiment of an interaction between a process control environment 180, a manufacturing/processing environment 170, and a simulation environment 210 is illustrated. In one embodiment the process control environment 180 receives input data from the simulation environment 210, which is then used to control the operation of the manufacturing environment 170. The integration of the simulation environment 210 and the process control environment 180 into the manufacturing environment 170 facilitates more accurate control of the processing of semiconductor wafers. The simulation environment 210 allows for testing various manufacturing factors in order to study and evaluate the interaction between the manufacturing factors. This evaluation can be used by the system 100 to prompt the process control environment 180 to invoke more accurate process control.

Furthermore, the simulation environment 210 can be used for feedback modification of control parameters invoked by the process control environment 180. For example, the manufacturing environment 170 can send metrology data results into the simulation environment 210. The simulation environment 210 can then use the metrology data results and perform various tests and calculations to provide more accurate, modified control parameters to the process control environment 180. A feedback loop in then completed when the process control environment 180 sends the modified or adjusted process control parameters to the manufacturing environment 170 for further processing of semiconductor wafers.

Figure 3:
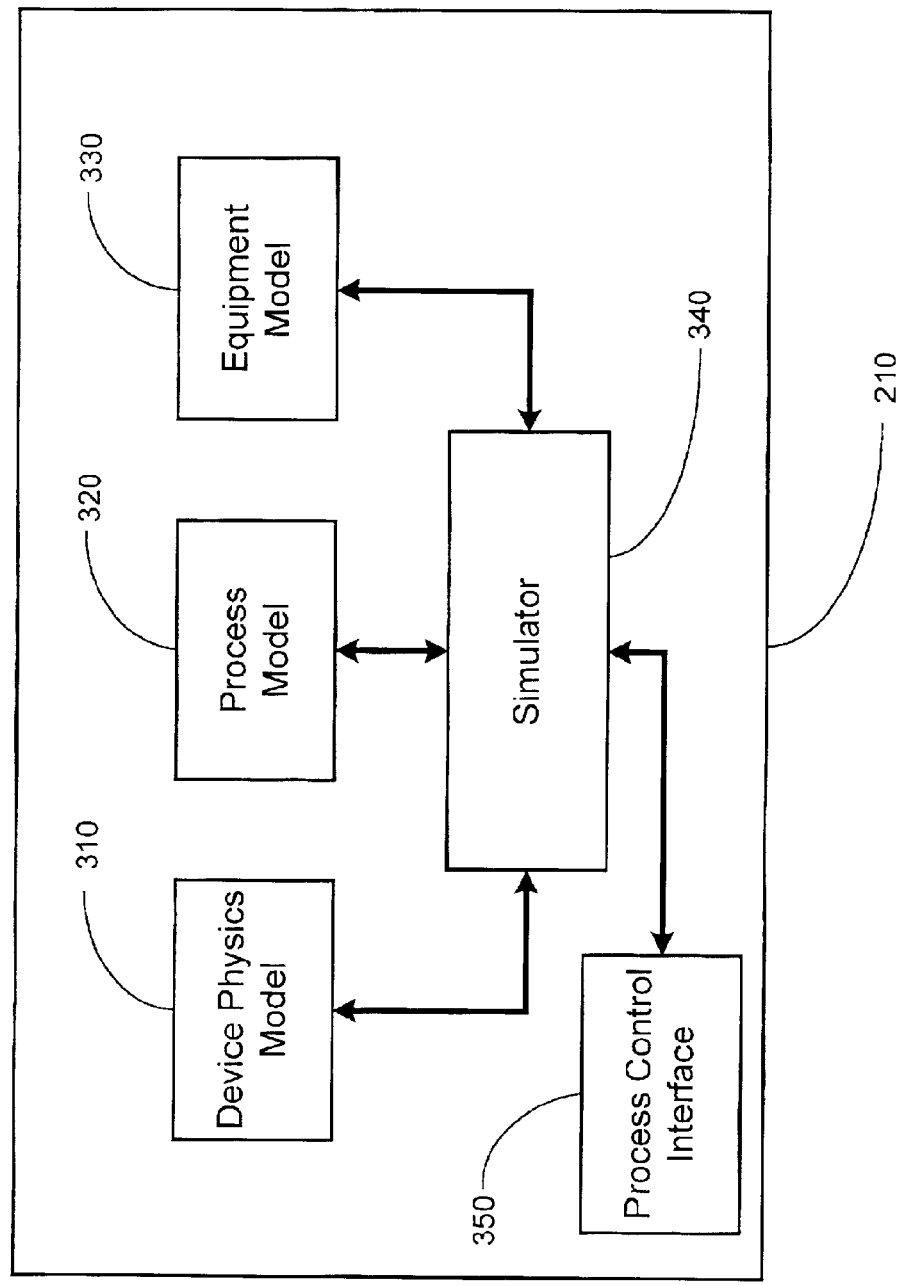
FIG. 3 illustrates a block diagram depiction of one embodiment of the simulation environment illustrated in FIG. 2, in accordance with one embodiment of the present invention.

Turning now to FIG. 3, a block diagram depiction of one embodiment of the simulation environment 210 is illustrated. In one embodiment the simulation environment 210 comprises a device physics model 310, a process model 320, and an equipment model 330, which are interfaced with a simulator 340. The models 310, 320, 330 are capable of emulating the behavior of various components of a semiconductor manufacturing facility.

The simulation environment 210 also comprises a process control interface 350, which is an interface that allows communications between the simulation environment 210 and the process control environment 180. The process control interface 350 also allows the simulation environment 210 to receive manufacturing data from the manufacturing environment 170, which can be used by the simulation environment 210 to perform feedback corrections during the manufacturing of semiconductor wafers.

In one embodiment, the blocks shown in FIG. 3 are software programs that can be controlled by the computer system 130. In an alternative embodiment, the blocks shown in FIG. 3 are firmware components. In yet another embodiment, the blocks shown in FIG. 3 are hardware components. In one embodiment, the device physics model 310, the process model 320, and the equipment model 330 perform the functions or conditions of the device, process, and equipment, respectively, during a particular manufacturing process. Therefore, modifications to any one of the three models 310, 320 and 330 can be made, and the interaction between the models 310, 320, and 330 can be analyzed by the simulator 340.

The information complied by the simulator 340, may be sent to the process control environment 180 via the process control interface 350. In one embodiment the process control environment 180 utilizes the simulation data received from the simulation environment 210 in order to make control parameter adjustments or modifications for controlling manufacturing processes.

In one embodiment, the device physics model 310 comprises components that can measure electrical characteristics of a semiconductor wafer being manufactured. The device physics model 310 also comprises components that emulate or measure growth of oxide film on a semiconductor wafer. The device physics model 310 also comprises components that can model the chemical reactions that can take place on a semiconductor wafer being processed.

The process model 320 comprises components that emulate an execution of manufacturing processes. The process model 320 comprises of components that control parameters that can be used for performing etch processes, photolithography processes, chemical-mechanical polishing processes, rapid-thermal annealing processes, implant processes, diffusion processes, and the like. The equipment model 330 comprises components that can model furnace behavior during semiconductor manufacturing processes. The equipment model 330 can also model the temperature response, pressure response, and at other such characteristics relating to equipment that performs manufacturing processing.

Modifications to any one of the components described above within any one of the models 310, 320, 330 can affect components in other models. For example, a change in a component, such as temperature change, caused in the equipment model 330 can affect a component that controls an etching process in the process model 320. This change, in turn, can affect electrical characteristics modeled by the device physics model 310. For example, the readings from an electrical measurement tool, such as a Spice® tool modeled in the device physics model 310, can change in response to a temperature change in the equipment model 330, which causes an etching process change in the process model 320.

Utilizing the simulator 340, changes to components in the models 310, 320, 330, can be studied and their effects can be measured. Changes to compensate for errors detected by the simulator 340 can be made to any one of the components in the models 310, 320, 330, and a theoretical control parameter adjustment or measurement can be produced. The simulation data can then be sent to the process control environment 180 via the process control interface 350. In one embodiment, the simulation data can be used to adjust the setting of the process control environment 180.

Figure 4:
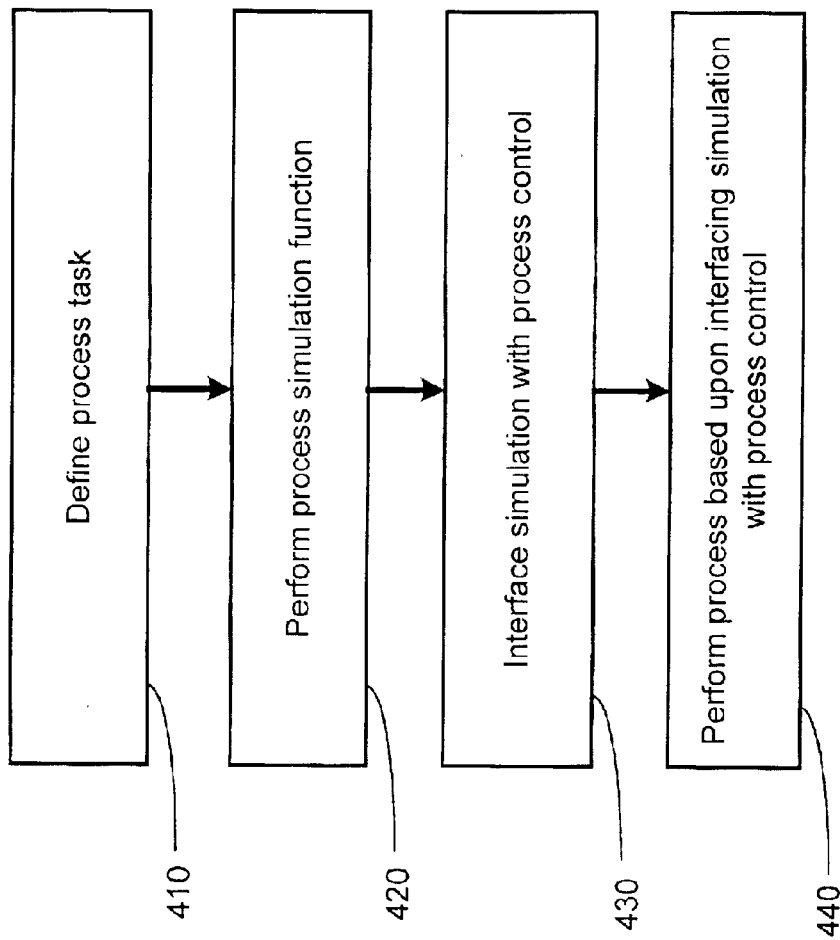
FIG. 4 illustrates a flowchart depiction of a method in accordance with one embodiment of the present invention.

Turning now to FIG. 4, a flow chart representation of the methods in accordance with the present invention is illustrated. In one embodiment, the system 100 defines a process task that is to be performed (block 410). The process task maybe a photolithography process, an etching process, and the like. The system 100 then performs a process simulation function (block 420). A more detailed description of the process simulation function described in block 420, is illustrated below. In one embodiment, a simulation data set results from the execution of the process simulation function.

Once the system 100 performs the process simulation function, the system 100 performs an interfacing function, which facilitates interfacing of the simulation data with the process control environment 180 (block 430). The process control environment 180 can utilize the simulation data in order to modify or define manufacturing control parameters that control the actual processing steps performed by the system 100. Once the system 100 interfaces the simulation data with the process control environment 180, the system 100 then performs a manufacturing process based upon the manufacturing parameters defined by the process control environment 180 (block 440).

Figure 5:
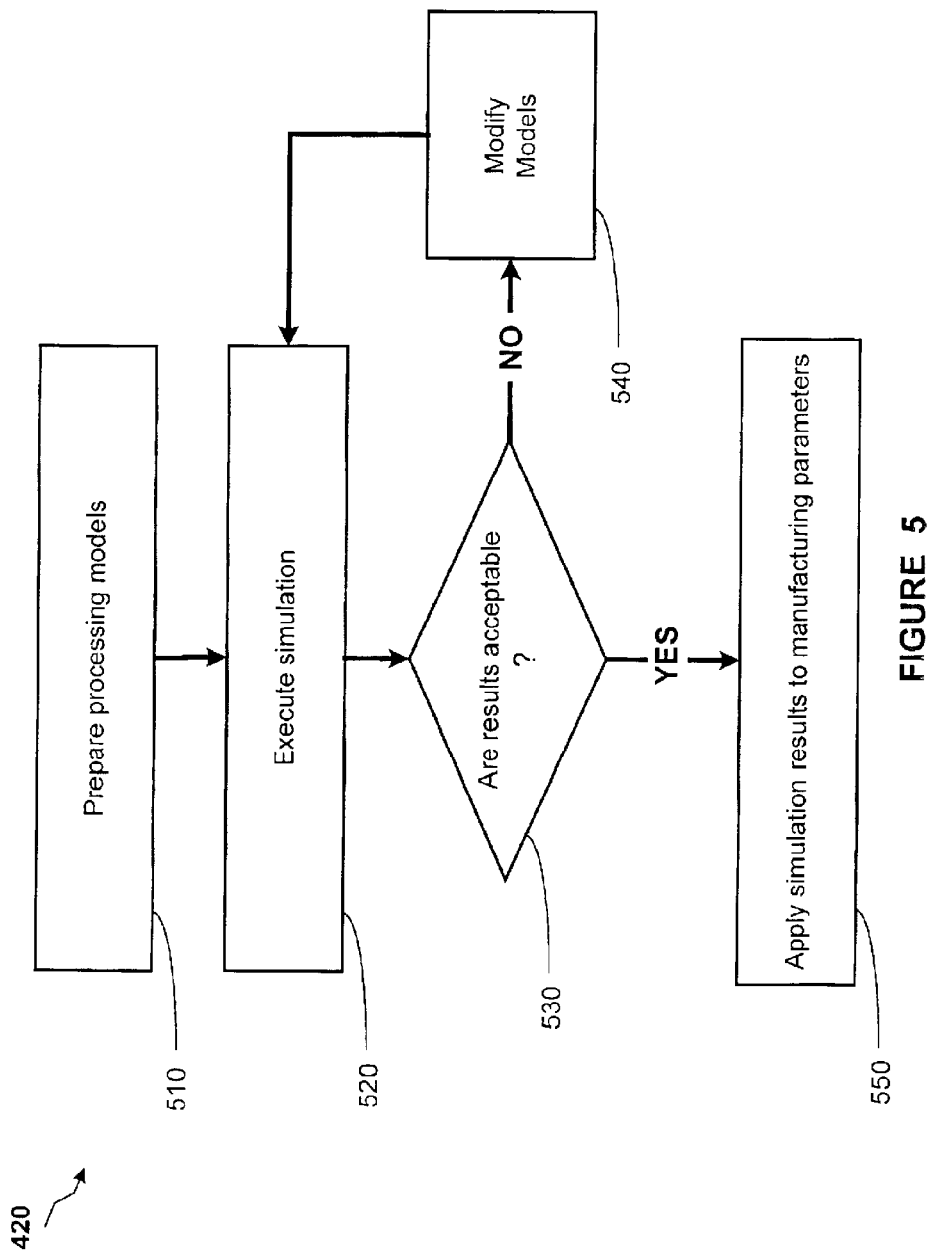
FIG. 5 illustrates a flowchart depiction of a method of performing a process simulation function, as described in FIG. 4, in accordance with one embodiment of the present invention.

Turning now to FIG. 5, a flowchart representation of the steps for performing the process simulation function described in block 440 of FIG. 4, is illustrated. The system 100 prepares one or more process models for simulation (block 510). The models that are prepared for simulation may include the device physics model 310, the process model 320, and the equipment model 330. The number of models defined by the system 100 generally depends upon the interactions of model-components that are to be examined by the simulator 340. In other words, the system 100 determines which components in a model are to be modified and which components are to be monitored for reactions caused by the original component modification. One embodiment of a flowchart depiction of the steps of preparing the processing models for simulation is illustrated in FIG. 6.

Figure 6:
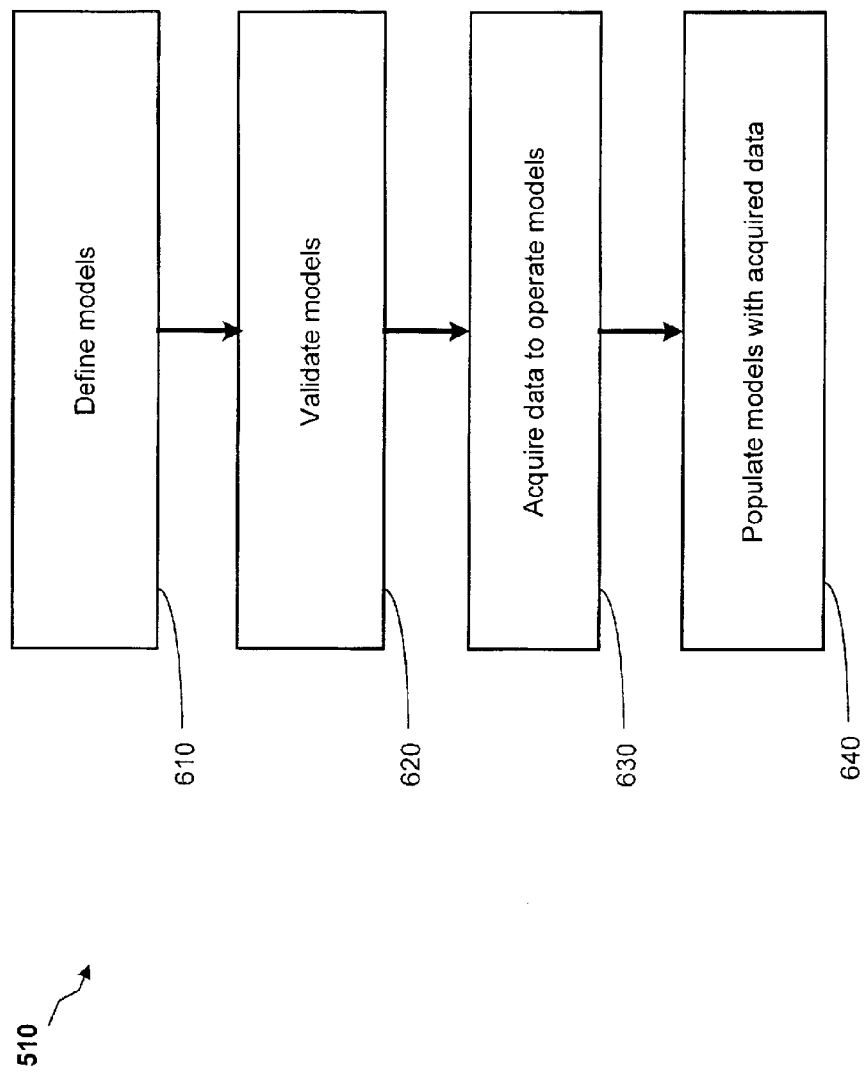
FIG. 6 illustrates a flowchart depiction of a method of preparing processing models, as described in FIG. 5, in accordance with one embodiment of the present invention.

Turning now to FIG. 6, in one embodiment, the system 100 defines the models 310, 320, 330 for execution by the simulator 340. The system 100 then validates the defined models (block 620). In other words, the system 100 integrates the defined models, such as the device physics model 310, the process model 320, and the equipment model 330, into a single manufacturing unit that is controlled by the simulator 340. Using the validated models, the simulation environment 210 can emulate the operations of an actual process control environment 180 that is integrated with a manufacturing environment 170.

Once the system 100 validates the defined models, the system 100 acquires data to operate the defined models (block 630). In one embodiment, the system 100 acquires data from the computer system 130 in order to operate the defined models. The system 100 then populates the defined models with the data acquired by the system 100 for operation of the models (block 640). In other words, the system 100 sends operation data, control parameter data, simulation data, and the like, to the defined models so that the defined models can perform a simulation as if an actual manufacturing process were being performed. The completion of the steps described in FIG. 6 substantially completes the step of preparing process models for simulation, as indicated in block 510 of FIG. 5.

Turning back to FIG. 5, once the system 100 prepares the process models, the system 100 executes a simulation (block 520). In one embodiment, the simulation environment 210 executes the simulation. A more detailed description of the simulation execution described in block 520 is provided below. Once the system 100 executes the simulation, the system 100 makes a determination whether the results from the simulation are acceptable as compared with a predetermined specification (block 530). In other words, a determination is made, given a set of control parameters and system definitions, as to whether the device physics model 310, the process model 320, and the equipment model 330, when executed using the control parameters and definitions, produce a theoretical semiconductor wafer that contains electrical characteristics that are within a specific predetermined specification.

When the system 100 determines that the results from the simulation are not within a predetermined acceptable specification, the system 100 modifies the defined models (block 540). More specifically, the system 100 modifies certain components within the defined models such that the effects from the modified component can trickle to other defined models and produce a more acceptable simulation result. For example, if the simulation result does not produce a predetermined target critical dimension for a particular gate on a theoretical semiconductor wafer, the temperature relating to the equipment model 330 can be modified such that the change trickled into the process model 320 and the device physics model 330 causes the critical dimension measurements to fall within a predetermined acceptable margin. In one embodiment, when the simulation environment 210 modifies the defined models, the simulation is executed again, as indicated in FIG. 5.

When the system 100 determines that the simulation results are within the predetermined acceptable specification, the system 100 applies the simulation results to manufacturing parameters (block 550). In other words, the simulation results are sent to the process control environment 180, via the process control interface 350, so that the process control environment 180 can utilize the simulation data in order to better control the processing of semiconductor wafers. The completion of the steps described in FIG. 5 substantially completes the step of performing the process simulation function described in block 420 of FIG. 4.

Figure 7:
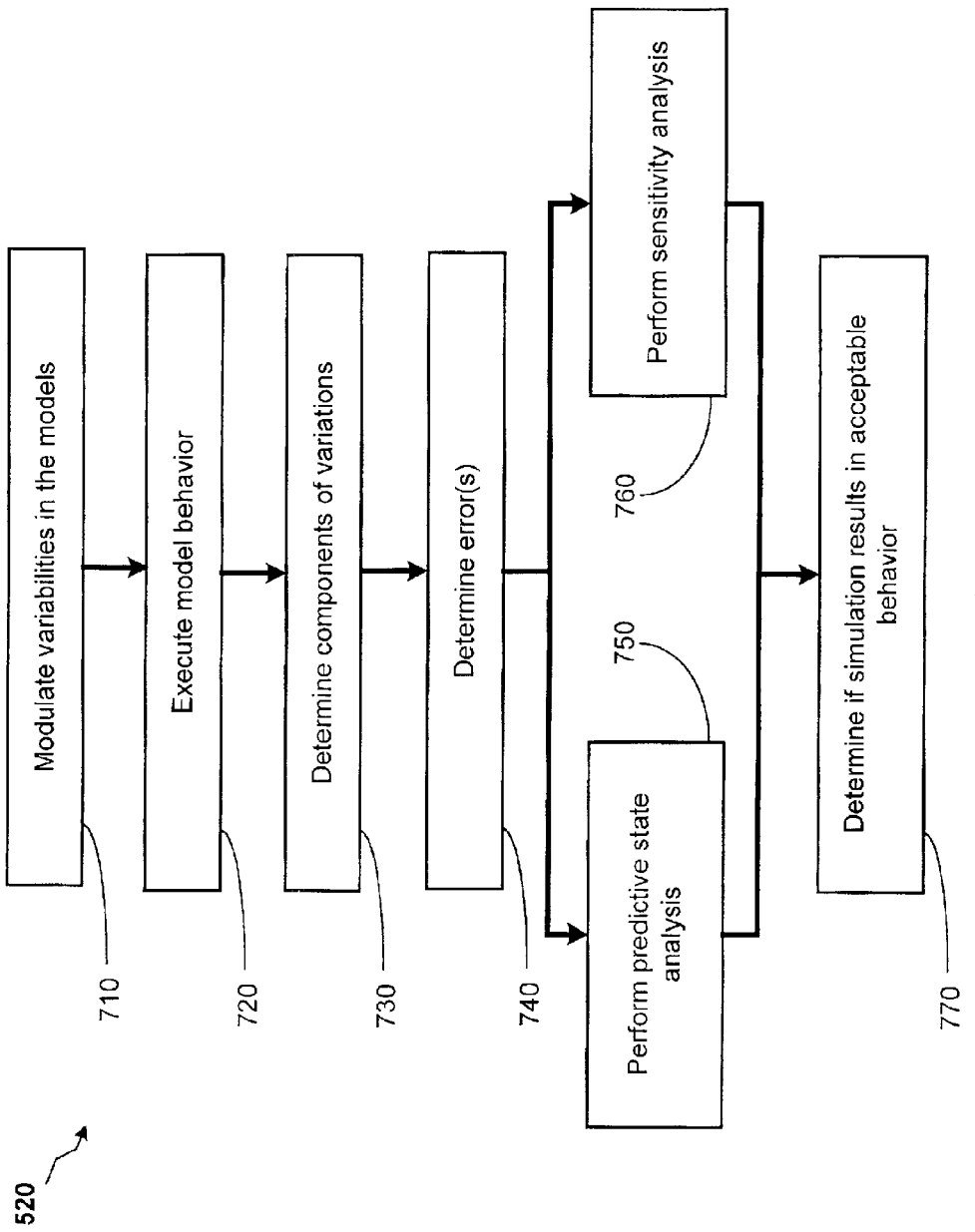
FIG. 7 illustrates a flowchart depiction of a method of validating defined models, as described in FIG. 5, in accordance with one embodiment of the present invention.

Turning now to FIG. 7, a flowchart depiction of the steps for executing the simulation described in block 520 in accordance with one embodiment of the present invention, is illustrated. The simulation environment 210 modulates variabilities into the defined models (block 710). In other words, the system 100 defines variations into the components of defined models in order to simulate the effects of online manufacturing performance by the models 310, 320, 330. For example, the system 100 invokes a temperature variability of plus or minus 3% of a defined operating temperature into the equipment model 330 to simulate the real online manufacturing effects of temperature variations in an actual processing environment.

When the simulation environment 210 modulates variabilities into the defined models, the simulation environment 210 executes the model behavior (720). In other words, using the populated data sent to the models 310, 320, 330, the simulation environment 210 performs the operations of the models 310, 320, 330. Once the model behavior is executed by the system 100, the system 100 determines components of variations in the operations of the defined models (block 730). The simulation environment 210 determines how components within the models 310, 320, 330 vary during the operation of the models 310, 320, 330. For example, the simulation environment 210 can study the electrical characteristics of a theoretically completed semiconductor wafer and determine how the temperature components in the equipment model 330 caused variations in the drive currents detected by the device physics model 310.

The simulation environment 210 then determines any error due to the variations in the components in the defined models (block 740). Using this error data, the system 100 performs a predictive state analysis (750). Performing the predictive state analysis comprises predicting how a certain component within one of the models 310, 320, 330 behaves in response to modifications to another component in any one of the models 310, 320, 330. Therefore, the system 100 can determine the optimum component levels to be implemented in order to achieve improved results during semiconductor manufacturing processes. In one embodiment, the predictive state analysis is preformed by the computer system 130. The predictive state analysis can be performed by one skilled in the art who has the benefit of the present disclosure. A more detailed description of the predictive state analysis is provided below.

The system 100 also performs a sensitivity analysis (block 760). In one embodiment the sensitivity analysis comprises an evaluation of how one component is sensitive to the modifications made to another component in any one of the defined models. For example, the drive current in the theoretically completed semiconductor wafer is examined to study the sensitivity of the drive current in response to a change made in a temperature component in the equipment model 330. The sensitivity analysis can be performed by those skilled in the art and having the benefit of the present disclosure.

Once the system 100 performs the predictive state analysis and the sensitivity analysis described in blocks 750 and 760 respectively, the system 100 determines whether the simulation results fall within an acceptable predetermined specification (block 770). The results from the simulation analysis performed by the system 100 are analyzed to determine whether characteristics of the theoretically completed semiconductor wafer are within predetermined specifications. The predetermined specifications described throughout the present disclosure can be determined by those skilled in the art. The completion of the steps described in FIG. 7 substantially completes the step of executing the simulation described in block 520 of FIG. 5.

Figure 8:
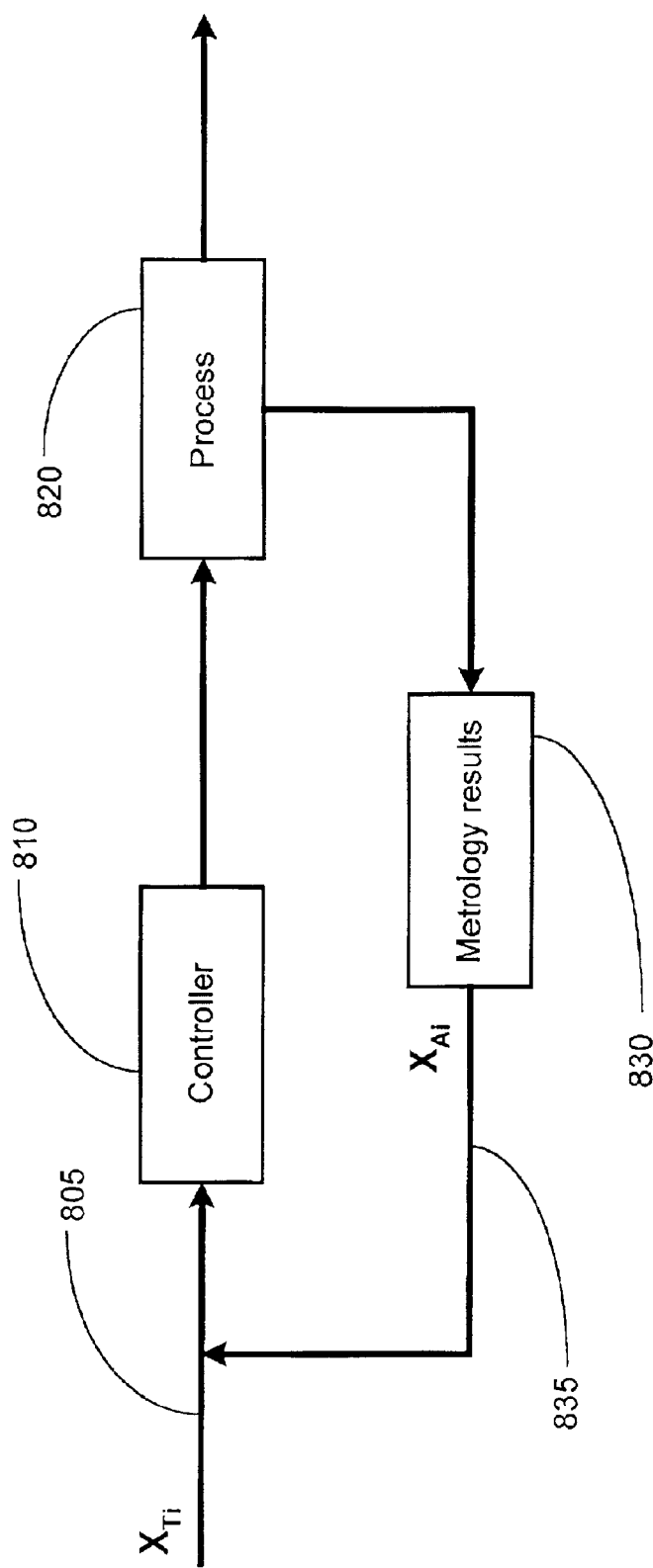
FIG. 8 illustrates a simplified feedback block diagram in accordance with one embodiment of the present invention.

Turning now to FIG. 8, a simplified process control system block diagram is illustrated. The controller 810 controls a process 820 that is performed on a silicon wafer. The input to the controller on a line 805, is denoted by the term $X_{Ti}$, which represents a target performance of the processed semiconductor wafer ($S_i$). Once a particular silicon wafer, $S_i$, is processed, metrology results 830 will define the actual performance of the processed semiconductor wafer $S_i$, which is denoted by the term $X_{Ai}$. The actual performance factor, $X_{Ai}$ is fed back into the line 805 which is sent to the controller for further adjustments.

Figure 9:
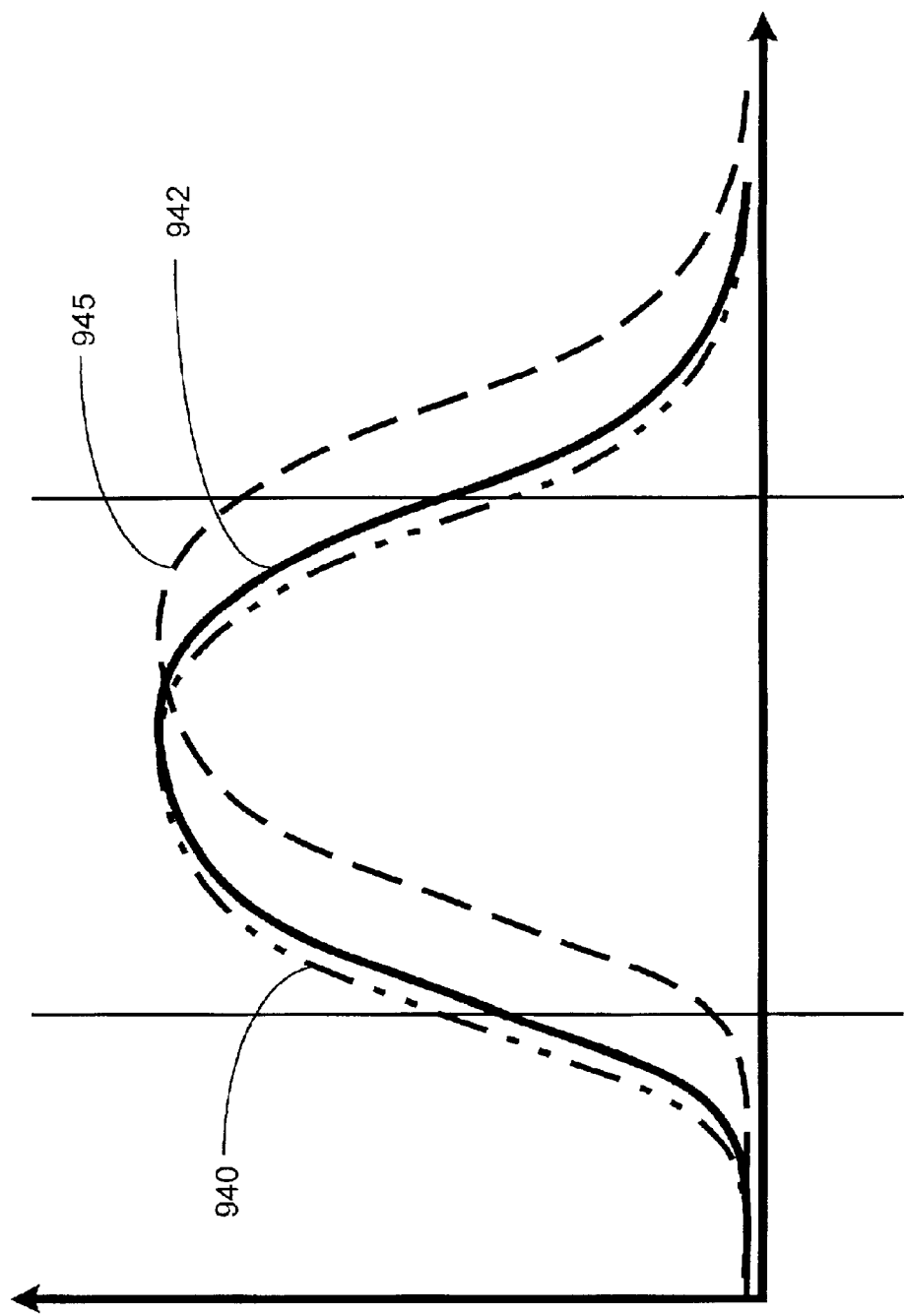
FIG. 9 illustrates three Gaussian-style distribution curves that represent a predicted, desired, and an actual distribution curve.

A function that represents the electrical parameter of the processed semiconductor wafer $S_i$ can be defined by Equation 1;

$$Y=f([S_1, P_1], [S_2, P_2] \ldots [S_i, P_i]), \quad \text{Equation 1}$$

where $S_i$ is a silicon wafer being processed and $P_i$ is corresponding process being performed on $S_i$. The electrical parameter is a function of a particular silicon wafer and the process being performed on that silicon wafer. The function Y can be used to analyze a distribution chart illustrated in FIG. 9. FIG. 9 illustrates three distribution curves. A predicted distribution curve 940, a desired distribution curve 942 relating to the performance of the processed silicon wafer $S_i$, and an actual distribution curve 945 are illustrated in FIG. 9. The desired distribution of the performance of the silicon wafer $S_i$ is generally driven by many factors such as the market requirements. For example, the market may require a particular speed of operations of circuits or products that results from the processed silicon (semiconductor) wafer $S_i$.

Figure 10:
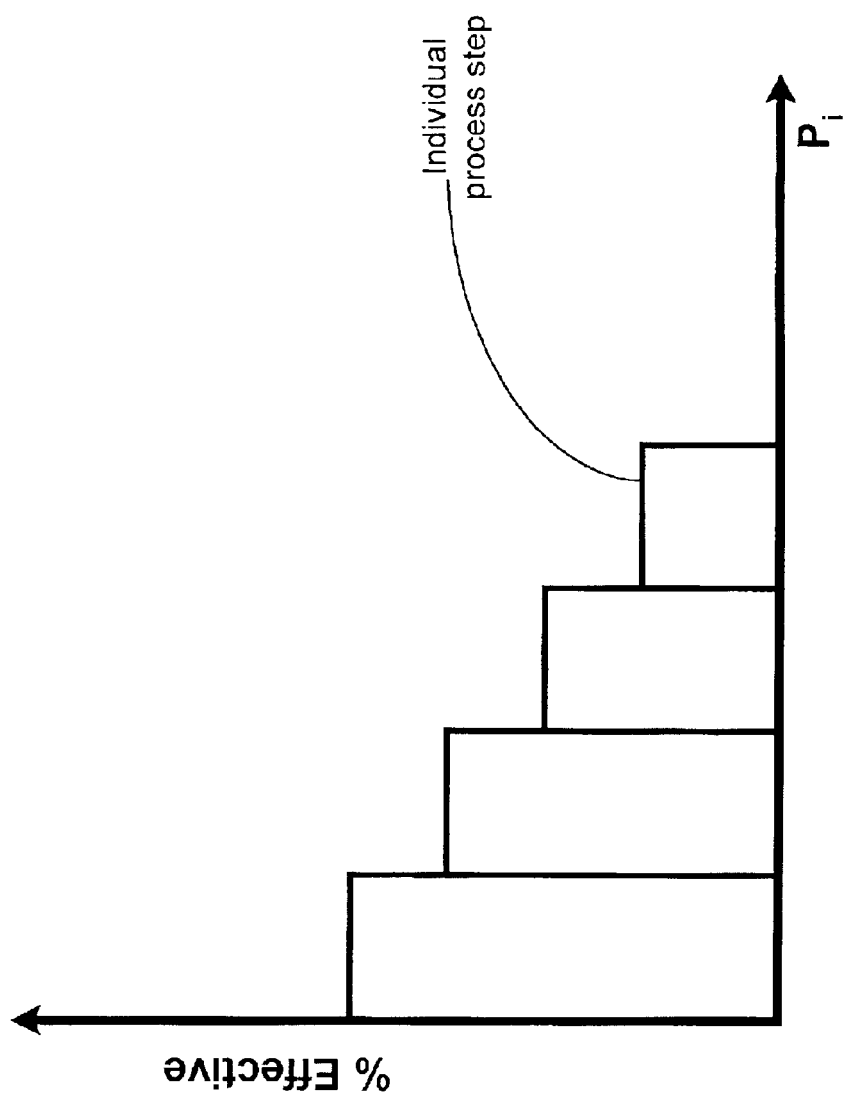
FIG. 10 illustrates a graph that relates an effective percentage value with a particular process.

FIG. 10 illustrates a chart that represents the percentage effectiveness of the each process performed on each silicon wafer ($S_1, S_2 \ldots S_i$). Some processes $P_i$ can be more effective than others in reaching a desired performance goal. The electrical parameter Y, relating to the processed silicon wafer $S_i$, is generally a multi-variant function of $S_i$ process steps, as illustrated by Equation 2.

$$Y=f(S_1, S_2, S_3 \ldots S_i) \quad \text{Equation 2}$$

The system 100 then optimizes the simulation (described above) to find more optimal process target ($T_i$) for each silicon wafer, $S_i$, to be processed. These target values are then used to generate new control inputs, $X_{Ti}$, on the line 805 to control a subsequent process of a silicon wafer $S_i$. The new control inputs, $X_{Ti}$, are generally based upon a plurality of factors, such as simulation data, output requirements, product performance requirements, process recipe settings based on a plurality of processing tool 120 operating scenarios, and the like.

The applications of the steps described above will aid in converging the desired distribution curve 942 with the actual distribution curve 945. The principles described in the present disclosure can be utilized to improve the performance of a variety of semiconductor manufacturing processes.

The principles taught by the present invention can be implemented in an Advanced Process Control (APC) Framework. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    defining a process task;
    performing a process simulation function to produce simulation data corresponding to said process task, performing said process simulation function comprising:
        generating a first model to perform a simulation;
        generating a second model for processing a semiconductor device, an operation of said second model being capable of affecting said first model; and
    interfacing said simulation data with a process control environment for controlling a manufacturing process of said semiconductor device using at least one of said first and second model.

2. The method described in claim 1, further comprising performing a manufacturing process of the semiconductor device based upon said interfacing of said simulation data with said process control environment.

3. The method described in claim 2, wherein performing manufacturing process of said semiconductor device further comprises processing a semiconductor wafer.

4. The method described in claim 3, wherein defining a process task further comprises a photolithography process task.

5. The method described in claim 3, wherein defining a process task further comprises defining an etch process task.

6. The method described in claim 3, wherein defining a process task further comprises defining a chemical-mechanical polishing process task.

7. The method described in claim 3, wherein defining a process task further comprises defining an implant process task.

8. The method described in claim 3, wherein defining a process task further comprises defining a diffusion process task.

9. The method described in claim 3, wherein performing a process simulation function further comprises:
preparing said first model for simulation;
executing a simulation using said first model to generate a simulation result;
determining whether said simulation result is within a predetermined specification; and
applying said simulation result into at least one manufacturing parameter in response to a determination that said simulation result is within said predetermined specification.

10. The method described in claim 9, further comprising modifying said first model in response to a determination that said simulation result is not within said predetermined specification.

11. The method described in claim 9, wherein preparing said first model for simulation further comprises:
defining said first model to generate a third defined model;
validating said third defined model;
acquiring data for operation of said third defined model;
preparing a fourth acquired model from said data; and
populating said third defined model with at least a portion of said fourth acquired model.

12. The method described in claim 11, wherein defining at least one one of said first and second models further comprises defining at least one of a device physics model, a process model, and an equipment model.

13. The method described in claim 11, wherein validating said defined model further comprises integrating a plurality of defined models into a simulation environment.

14. The method described in claim 9, wherein executing said simulation using said processing model to generate a simulation result further comprises:
modulating at least one variable in said processing model;
executing model behavior based upon said variable;
determining at least one component of variation based upon said execution of the model behavior; and
determining whether said at least one component of variation is within a predetermined specification.

15. The method described in claim 14, wherein modulating at least one variability in said processing model further comprises modulating a temperature component.

16. The method described in claim 14, further comprising performing a predictive state analysis in response to said execution of said model behavior.

17. The method described in claim 14, further comprising performing a sensitivity analysis in response to said execution of said model behavior.

18. The method described in claim 9, wherein applying said simulation result into at least one manufacturing parameter further comprises modifying at least one manufacturing control parameter based upon said simulation result.

19. An apparatus, comprising:
means for defining a process task;
means for performing a process simulation function to produce simulation data corresponding to said process task; and
means for interfacing said simulation data with a process control environment for controlling a manufacturing process of a semiconductor device.

20. A method, comprising:
defining a process task;
performing a process simulation function to produce simulation data corresponding to said process task, said process simulation function comprising:
preparing at least one processing model for simulation;
executing a simulation using said processing model to generate a simulation result;
generating a defined model based upon said simulation;
determining whether said simulation result is within a predetermined specification; and
applying said simulation result into at least one manufacturing parameter in response to a determination that said simulation result is within said predetermined specification;
preparing an acquired model from said data;
populating said defined model with said acquired model; and
interfacing said simulation data with a process control environment for controlling a manufacturing process of a semiconductor device using said defined model.

21. The method described in claim 20, further comprising modifying said model in response to a determination that said simulation result is not within said predetermined specification.

22. The method described in claim 20, wherein preparing at least one processing model for simulation further comprises:
defining at least one processing model, to generate a defined model;
validating said defined model;
acquiring data for operation of said defined model;
preparing an acquired model from said data; and
populating said defined model with said acquired model.

23. The method described in claim 22, wherein defining at least one processing model further comprises defining at least one of a device physics model, a process model, and an equipment model.

24. The method described in claim 22, wherein validating said defined model further comprises integrating a plurality of defined models into a simulation environment.

25. The method described in claim 20, wherein executing said simulation using said processing model to generate a simulation result further comprises:
modulating at least one variable in said processing model;
executing a model behavior based upon said variable;
determining at least one component of variation based upon said execution of the model behavior; and
determining whether said at least one component of variation is within a predetermined specification.

26. A method, comprising:
defining a process task;
performing a process simulation function to produce simulation data corresponding to
said process task; performing said process simulation function comprising:
preparing at least one processing model for simulation to generate a defined model;
validating said defined model by determining whether said simulation result is within a predetermined specification;
acquiring data for operation of said defined model;
preparing an acquired model from said data for operation;
populating said defined model with at least a portion of said acquired model; and
interfacing said simulation data with a process control environment for controlling a manufacturing process of said semiconductor device using at least one of said defined model and said acquired model.

27. The method described in claim 26, wherein defining at least one processing model further comprises defining at least one of a device physics model, a process model, and an equipment model.

28. The method described in claim 26, wherein validating said defined model further comprises integrating a plurality of defined models into a simulation environment.

29. The method described in claim 26, wherein performing said process simulation function further comprises:

modulating at least one variable in said processing model;

executing a model behavior based upon said variable;

determining at least one component of variation based upon said execution of said model behavior; and determining whether said at least one component of variation is within a predetermined specification.

30. The method described in claim 29, further comprising performing a predictive state analysis in response to said performing of said process simulation function.

31. The method described in claim 29, further comprising performing a sensitivity analysis in response to said performing of said process simulation function.

* * * * *